United States Patent
Hasegawa et al.

(10) Patent No.: US 6,500,225 B2
(45) Date of Patent: Dec. 31, 2002

(54) METHOD FOR PRODUCING HIGH DENSITY INDIUM-TIN-OXIDE SINTERED BODY

(75) Inventors: Akira Hasegawa, Ibaraki (JP); Shinji Fujiwara, Tsukuba (JP); Kunio Saegusa, Yawara-mura (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/447,583

(22) Filed: Nov. 23, 1999

(65) Prior Publication Data

US 2002/0012599 A1 Jan. 31, 2002

(30) Foreign Application Priority Data

Dec. 3, 1998 (JP) ............................................. 10-344242

(51) Int. Cl.$^7$ ................................................. B22F 3/12
(52) U.S. Cl. .............................. 75/234; 419/19; 419/38; 419/45; 419/47
(58) Field of Search ............................. 419/19, 38, 45, 419/57; 75/234

(56) References Cited

U.S. PATENT DOCUMENTS 5,071,800 A * 12/1991 Iwamoto ..................... 501/126
5,866,493 A * 2/1999 Lee et al. .................... 501/134
5,980,815 A * 11/1999 Matsunaga et al. ......... 264/681
6,033,620 A * 3/2000 Utsumi et al. ............... 264/674
6,099,982 A * 8/2000 Okabe et al. ................ 428/697

FOREIGN PATENT DOCUMENTS

| JP | 3-126655 | 5/1991 |
| JP | 3-207858 | 9/1991 |
| JP | 6-48816 | 2/1994 |
| JP | 6-183732 | 7/1994 |
| JP | 6-299344 | 10/1994 |
| JP | 10-72253 | 3/1998 |

* cited by examiner

Primary Examiner—Daniel J. Jenkins
(74) Attorney, Agent, or Firm—Sughrue Mion, PLLC

(57) ABSTRACT

A method for producing an indium-tin-oxide sintered body comprising the steps of;

molding a powder comprising indium, tin and oxygen, and sintering the molded article in oxygen gas-containing atmosphere, wherein the halogen content of the powder comprising indium, tin and oxygen is 0.02% by weight or less, the concentration of oxygen in the oxygen gas-containing atmosphere is 90% or more during the sintering, the partial pressure of moisture contained in the oxygen gas-containing atmosphere is 800 Pa or less during the sintering, and the molded article is maintained at a temperature in the range from 1500 to 1650° C. for 1 hour or more for the sintering.

7 Claims, No Drawings

METHOD FOR PRODUCING HIGH DENSITY INDIUM-TIN-OXIDE SINTERED BODY

FIELD OF THE INVENTION

The present invention relates to a method for producing a high density indium-tin-oxide sintered body.

BACKGROUND OF THE INVENTION

Indium-Tin-Oxide, indium oxide-tin oxide solid solution films are utilized as a transparent electrode of a plane display material for a liquid crystal display and the like because of high conductivity and excellent transparency.

As a method for forming an indium-tin-oxide film, there are listed a method in which an indium-tin-oxide powder is applied on a substrate, a method in which an indium-tin-oxide film is formed on the surface of a substrate by sputtering method using an indium-tin-oxide sintered target obtained by molding a raw material oxide powder and sintering the molded article, as well as other methods.

According to the method in which an indium-tin-oxide powder is applied on a substrate, the resulted film has high resistance and is not used as a practical transparent electrode. Consequently, almost all indium-tin-oxide films are produced by sputtering.

Regarding the sputtering method, a method using an In-Sn alloy as a target has been conventionally used, however, the resulted film had problems in controllability and reproducibility. Therefore, a method using an indium-tin-oxide sintered body as a target is dominantly used nowadays. However, a method for producing an indium-tin-oxide film by sputtering method using an indium-tin-oxide sintered body target heretofore had a problem that there is required an operation called cleaning in which the sputtering is stopped for taking out an indium-tin-oxide target and the nodule is excised, leading to decrease in productivity because of occurrence of blackening phenomenon on the surface of an indium-tin-oxide target called nodule.

It is known that occurrence of this nodule tends to occur in a low density indium-tin-oxide target and if a high density indium-tin-oxide target is used, occurrence of nodule is suppressed, cleaning process can be abbreviated, and productivity increases consequently.

As other problems of a low density indium-tin-oxide target, there are indicated a problem that resistance increases during sputtering leading to decrease in sputtering efficiency, a problem that ash called particle grows in a sputtering apparatus, and adheres on a substrate for an indium-tin-oxide film, leading to deterioration of an indium-tin-oxide film formed and breaking of a fine indium-tin-oxide film pattern, a problem that due to high resistance of a low density indium-tin-oxide target, productivity of sputtering is low, and when power supply is increased, abnormal discharge occurs and sputtering can not conducted in stable fashion, and the like.

Therefore, various suggestions have been conventionally made for enhancing the density of an indium-tin-oxide sintered body. For example, there is a method in which a high density indium-tin-oxide sintered body is obtained by sintering under pressure using a hot press method or hot isostatic press (hereinafter, abbreviated as HIP) method. However, in the hot press method and HIP method, only a non-uniform indium-tin-oxide target is obtained because tin oxide can not be made into sufficient solid solution and the resistance of an indium-tin-oxide target can not be decreased since temperature can not be increased in the method. Further, when the hot press method or HIP method is used, the price of a product increases due to an expensive equipment required.

There is also suggested a method in which indium-tin-oxide powders are sintered in a pressured oxygen gas atmosphere (Japanese Patent Application Laid-Open (JP-A) No. 3-207858), however, it has a problem that the price of a production is high since an expensive special equipment which can endure pressure is required for conducting sintering in a pressured oxygen gas atmosphere. Further, it includes problems regarding safety of a high pressure oxygen gas atmosphere, and the like.

There is also suggested a method in which indium-tin-oxide powders are sintered in an oxygen gas atmosphere under an atmospheric pressure (Japanese Patent Application Laid-Open (JP-A) No. 6-299344), however, it has a problem that a high density ITO sintered body can not be obtained.

Furthermore, there is also suggested a method in which a tin oxide powder having larger diameter is mixed with a fine indium oxidepowder (JP-A No. 6-183732), however, this method is not necessarily sufficient for achieving high density.

SUMMARY OF THE INVENTION

The object of the present invention is to provide a high density indium-tin-oxide sintered body which is excellent in property as a sputtering target and is industrially useful, in a method for producing an indium-tin-oxide sputtering target comprising molding an indium-tin-oxide powder and then sintering the molded one.

The present inventors have intensively studied for solving the above-described problems, and have found that increase in the density of the final sintered body is promoted when the partial pressure of moisture in an indium-tin-oxide sintering atmosphere is lower or the concentration of oxygen in an indium-tin-oxide sintering atmosphere is higher, and have completed the present invention.

Namely, the present invention provides a method for producing an indium-tin-oxide sintered body comprising the steps of;

molding a powder comprising indium, tin and oxygen, and sintering the molded article in oxygen gas-containing atmosphere, wherein the halogen content of the powder comprising indium, tin and oxygen is 0.02% by weight or less, the concentration of oxygen in the oxygen gas-containing atmosphere is 90% or more during the sintering, the partial pressure of moisture contained in the oxygen gas-containing atmosphere is 800 Pa or less during the sintering, and the molded article is maintained at a temperature in the range from 1500 to 1650° C. for 1 hour or more for the sintering.

DETAILED DESCRIPTION OF THE INVENTION

The present invention will be described in detail below.

As a powder comprising indium, tin and oxygen, a powder comprising indium, tin and oxygen which can be produced according to a method for producing an indium-tin-oxide powder described in JP-A No. 10-72253, a mixed powder of an indium oxide powder and a tin oxide powder, a mixed powder of an indium-tin-oxide powder and tin oxide powder, a mixed powder of an indium-tin-oxide powder and indium oxide powder and the like are listed. Hereinafter, these powders are abbreviated and called ITO or ITO powder in the present invention. These are made into molded articles by the following methods.

Said powder can be optionally selected so that the content of tin oxide in an ITO sintered body preferably from 1 to 50% by weight, more preferably from 2 to 20% by weight.

Said powder preferably does not contain halogen, and the halogen content of the powder is preferably not more than 0.02% by weight.

It is preferable to use said powder having a primary particle size calculated by BET specific surface area of the powder of preferably from over 0.05 μm to 1 μm or less, more preferably from over 0.1 μm to 0.5 μm or less.

It is preferable to grind said powder since the secondary particle may sometimes be larger due to coagulation. The central particle size calculated by particle size distribution after grinding is preferably not over 1 μm.

As the grinding method, dry ball mill grinding, wet ball mill grinding, jet mill grinding or combination thereof can be used.

By using such preferable said powder, a high density ITO sintered body can be obtained which has a sintered body density of 7.10 g/cm$^3$ or more and compacted to 99% or more of the true density (the true density of ITO is 7.16 g/cm$^3$).

Then, said powder is molded into desired form, further sintered to obtain an ITO sintered body.

As a method for obtaining a molded article of said powder used in the present invention, various methods can be used, and there are listed, for example, dry press, cool isostatic molding press (CIP) and the like as the dry molding method, slip casting, deep casting and the like as the wet molding method, other injection molding methods and the like. In the case of the dry molding method, if a powder is previously made into a slurry and then made into a granule by spray dry and the like, such effects are obtained that operability in molding increases, a more uniform molded article is obtained, and the like.

In the molding, a dispersing agent for enhancing dispersibility of a powder, a binder for imparting shape keeping property, a releasing agent of easy unloading from a mold, a lubricant for reducing mutual friction of powders, and the like are added if necessary. As the dispersing agent, nonionic, cationic surfactants and the like, as the binder, polymers such as polyvinyl alcohol, polyethylene glycol, polymethylmethacrylate and the like, as the releasing agent, micro wax emulsion and the like, as the lubricant, glycerin and the like, are suitably used.

Thus obtained molded article of said powder is sintered and compacted. The sintering is an operation for mutual adhesion of powders by way of diffusion and requires high temperature, but can be conducted using a usual sintering apparatus such as an electric furnace and the like.

In sintering, the molded article is maintained at a temperature in the range from 1500 to 1650° C. for 1 hour or more, preferably 3 hours or more.

Before sintering, the molded article is preferably maintained at a lower temperature than that in initiation of the sintering, namely at a temperature in the range from 1000 to 1300° C. for 1 hour or more, further, 3 hours or more.

In the present invention, sintering is preferably conducted in an oxidizing atmosphere, namely, an oxygen gas-containing atmosphere, air having enhanced oxygen concentration, oxygen atmosphere and the like are listed and an atmosphere having an oxygen concentration of 90% or more is preferable, and an atmosphere having an oxygen concentration of 95% or more is more preferable. It is preferable that an oxygen gas-containing atmosphere in sintering contains no moisture, and regarding the moisture content, the partial pressure of moisture is 800 Pa or less, preferably 400 Pa or less, further preferably 200 Pa or less.

For reducing the moisture content of an oxygen gas-containing atmosphere in sintering, it is preferable to removed the remaining moisture and moisture adhered to a furnace wall, furnace material, heat insulation material and the like, by evacuation inside of an electric furnace. It is also preferable to reduce the amount of moisture in the atmosphere in an electric furnace by flowing an oxygen gas having low moisture content such as an oxygen gas filled in an oxygen bomb. There is also a method to reduce the amount of moisture dissolved in a gas by passing the gas through a desiccant and the like.

According to the method for producing an ITO sintered body of the present invention, a high density ITO sintered body is obtained, and when the instant sintered body is used as a sputtering target, reduction of nodule, improvement in sputtering efficiency, decrease in a particle, reduction of abnormal discharge, enhancement of quality of a formed ITO film, and the like can be achieved.

A compact high density ITO sintered body has excellent property as an ITO sputtering target and industrially useful.

A sputtering target for manufacturing a transparent conductive film such for a liquid crystal display (LCD) and the like is obtained by a usual method for producing an ITO target in which an ITO sintered body of the present invention is cut and polished, and bonded to a copper backing plate by indium solder.

EXAMPLES

The following examples further illustrate the present invention but do not limit the scope of the invention.

Measurement of the density of a sintered body in the present invention was conducted as follows. Measurement of density of ITO sintered body The bulk density of an ITO sintered body was measured by Archimedes method (buoyancy method) according to of JIS Z 8807-1976 and JIS R 2205-1992.

The true density for calculating relative density was 7.16 g/cm$^3$ according to the following formula. It was calculated according to the following formula using the density of indium oxide of 7.18 g/cm$^3$ and the density of tin oxide of 6.95 g/cm$^3$.

(density of ITO powder)=(density of indium oxide)×(content)+ (density of tin oxide)×(content)

7.16 g/cm$^3$=7.18 g/cm$^3$×0.9+6.95 g/cm$^3$×0.1

Example 1

An oxidized powder consisting of indium, tin and oxygen having a BET specific surface area of 3.26 m$^2$/g and a primary particle size calculated by BET specific surface area of 0.26 m was ground by a ball mill. The composition of indium, tin and oxygen of this powder was controlled so that the ratio by weight calculated in terms of oxides [SnO$_2$/ (In$_2$O$_3$+SnO$_2$)] was 10%. This powder was analyzed by a fluorescent X-ray analyzing method to find no peak of chlorine and a chlorine content of the powder of 100 ppm (0.01% by weight) or less. After the powder was ground by a ball mill, the central particle size D50 measured by a laser diffraction method was 0.6 μm. A binder was added to this powder and the mixtures was spray-dried to give a granule. This granule was filled in a mold having a diameter φ of 20 mm, and molded uni-axially under pressure at 100 kg/cm$^2$, then, CIP pressing was conducted at a pressure of 3 ton/cm$^2$. The resulted molded article was placed into an electric furnace for degreasing, and heated up to 600° C. to degrease it.

The molded article after completion of the degreasing was placed into an electric furnace for sintering and air in the furnace was evacuated by a vacuum pump. A dry oxygen gas having purity of 99.5% or more in an oxygen bomb was introduced into the electric furnace to substitute the atmosphere in the electric furnace by the dried oxygen gas. After the substitution, the electric furnace was heated while flowing the dried oxygen gas at a flow rate of 500 ml/min. The furnace was heated up to 1200° C. at a heating rate of 200° C./hour and maintained at 1200° C. for 12 hours, then, heated up to 1600° C. at a heating rate of 200° C./hour. It was sintered at 1600° C. for 10 hours to obtain an ITO sintered body. For checking the partial pressure of moisture in the atmospheric oxygen gas during sintering, the dewpoint of a gas discharged through gas outlet of the electric furnace was measured by a dew point instrument. The dew point was −70° C. and the partial pressure of moisture in oxygen gas in the sintering atmosphere was 0.26 Pa. The density of the resulted sintered body was 7.142 g/cm$^3$ and the relative density was 99.75%.

Example 2

A molded article which had been degreased obtained in the same manner as in Example 1 was placed in an electric furnace for sintering and air in the furnace was evacuated by a vacuum pump. A dry oxygen gas in an oxygen bomb was bubbled through water for humidification, and mixed with a dry oxygen gas in an oxygen bomb to produce a wet oxygen gas so controlled that it had a dew point of −40° C. The wet oxygen gas was introduced into the electric furnace to substitute the atmosphere in the electric furnace by the wet oxygen gas. After the substitution, the electric furnace was heated while flowing the wet oxygen gas at a flow rate of 500 ml/min. The furnace was heated in the same manner as in Example 1. It was sintered at 1600° C. for 10 hours to obtain an ITO sintered body. For checking the partial pressure of moisture in the atmospheric oxygen gas during sintering, the dew point of a gas discharged through gas outlet of the electric furnace was measured by a dew point instrument. The dew point was −40° C. and the partial pressure of moisture in oxygen gas in the sintering atmosphere was 13 Pa. The density of the resulted sintered body was 7.142 g/cm and the relative density was 99.75%.

Example 3

An ITO sintered body was obtained in the same manner as in Example 2 except that the flow rate of the wet oxygen gas bubbled through water and the flow rate of the dry oxygen gas were so controlled that the dewpoint was −20° C. The dewpoint of a gas discharged through gas outlet of the electric furnace was −20° C. and the partial pressure of moisture in oxygen gas in the sintering atmosphere was 104 Pa. The density of the resulted sintered body was 7.135 g/cm$^3$ and the relative density was 99.65%.

Example 4

An ITO sintered body was obtained in the same manner as in Example 2 except that the flow rate of the wet oxygen gas bubbled through water and the flow rate of the dry oxygen gas were so controlled that the dewpoint was −15° C. The dewpoint of a gas discharged through gas outlet of the electric furnace was −15° C. and the partial pressure of moisture in oxygen gas in the sintering atmosphere was 167 Pa. The density of the resulted sintered body was 7.130 g/cm$^3$ and the relative density was 99.58%.

Example 5

An ITO sintered body was obtained in the same manner as in Example 2 except that the flow rate of the wet oxygen gas bubbled through water and the flow rate of the dry oxygen gas were so controlled that the dewpoint was −10° C. The dewpoint of a gas discharged through gas outlet of the electric furnace was −10° C. and the partial pressure of moisture in oxygen gas in the sintering atmosphere was 262 Pa. The density of the resulted sintered body was 7.121 g/cm$^3$ and the relative density was 99.46%.

Example 6

An ITO sintered body was obtained in the same manner as in Example 2 except that the flow rate of the wet oxygen gas bubbled through water and the flow rate of the dry oxygen gas were so controlled that the dew point was 0° C. The dew point of a gas discharged through gas outlet of the electric furnace was 0° C. and the partial pressure of moisture in oxygen gas in the sintering atmosphere was 608 Pa. The density of the resulted sintered body was 7.054 g/cm$^3$ and the relative density was 98.52%.

Comparative Example 1

An ITO sintered body was obtained in the same manner as in Example 2 except that the flow rate of the wet oxygen gas bubbled through water and the flow rate of the dry oxygen gas were so controlled that the dew point was 10° C. The dew point of a gas discharged through gas outlet of the electric furnace was 10° C. and the partial pressure of moisture in oxygen gas in the sintering atmosphere was 1227 Pa. The density of the resulted sintered body was 6.852 g/cm$^3$ and the relative density was 95.70%.

Comparative Example 2

An ITO sintered body was obtained in the same manner as in Example 2 except that the flow rate of the wet oxygen gas bubbled through water and the flow rate of the dry oxygen gas were so controlled that the dew point was 15° C. The dew point of a gas discharged through gas outlet of the electric furnace was 15° C. and the partial pressure of moisture in oxygen gas in the sintering atmosphere was 1704 Pa. The density of the resulted sintered body was 6.718 g/cm$^3$ and the relative density was 93.82%.

Comparative Example 3

A molded article which had been degreased obtained in the same manner as in Example 1 was placed in an electric furnace for sintering and air in the furnace was evacuated by a vacuum pump. A dry oxygen gas in an oxygen bomb was bubbled through water for humidification. A wet oxygen gas was introduced into the electric furnace to substitute the atmosphere in the electric furnace by the wet oxygen gas. After the substitution, the electric furnace was heated while flowing the wet oxygen gas at a flow rate of 500 ml/min. The furnace was heated in the same manner as in Example 1. It was sintered at 1600° C. for 10 hours to obtain an ITO sintered body. Since the room temperature was 25° C. and the oxygen gas was bubbled through water, it is believed that the oxygen gas contains a saturated moisture of 25° C., the dew point of the oxygen gas in the sintering atmosphere is 25° C. and the partial pressure of moisture contained is 3167 Pa. The density of the resulted sintered body was 6.130 g/cm$^3$ and the relative density was 85.61%.

Example 7

A molded article which had been degreased obtained in the same manner as in Example 1 was placed in an electric furnace for sintering and air in the furnace was evacuated by a vacuum pump. A dry oxygen gas in an oxygen bomb was mixed with a dry nitrogen gas in a nitrogen bomb to obtain a mixed gas of an oxygen gas and a nitrogen gas in which the oxygen concentration was controlled to 95%. The mixed gas of an oxygen gas and a nitrogen gas was introduced into the electric furnace to substitute the atmosphere in the electric furnace by the mixed gas. After the substitution, the electric furnace was heated while flowing the mixed gas at a flow rate of 500 ml/min. The furnace was heated up to 1200° C. at a heating rate of 200° C./hour and maintained at 1200° C. for 12 hours, then, heated up to 1600° C. at a heating rate of 200° C./hour. It was sintered at 1600° C. for 10 hours to obtain an ITO sintered body. For checking the partial pressure of moisture in the mixed gas and the oxygen concentration during sintering, the dew point and oxygen concentration of a gas discharged through gas outlet of the electric furnace were measured by a dew point instrument and oxygen sensor, respectively. The dew point was −70° C., the partial pressure of moisture in oxygen gas in the sintering atmosphere was 0.26 Pa and the oxygen concentration was 95%. The density of the resulted sintered body was 7.124 g/cm$^3$ and the relative density was 99.50%.

Example 8

An ITO sintered body was obtained in the same manner as in Example 7 except that the oxygen concentration of the mixed gas was controlled to 90%. The dew point of a gas discharged through gas outlet of the electric furnace was −70° C., the partial pressure of moisture in oxygen gas in the sintering atmosphere was 0.26 Pa and the oxygen concentration was 90%. The density of the resulted sintered body was 7.096 g/cm$^3$ and the relative density was 99.10%.

Comparative Example 4

An ITO sintered body was obtained in the same manner as in Example 7 except that an oxygen gas and a nitrogen gas were mixed so that the oxygen concentration was 50%. The dew point of a gas discharged through gas outlet of the electric furnace was −70° C., the partial pressure of moisture in oxygen gas in the sintering atmosphere was 0.26 Pa and the oxygen concentration was 50%. The density of the resulted sintered body was 6.924 g/cm$^3$ and the relative density was 96.70%.

Comparative Example 5

An ITO sintered body was obtained in the same manner as in Example 1 except that the chlorine content of the powder measured by a fluorescent X-ray analyzing method was 300 ppm (0.03% by weight). The density of the resulted sintered body was 7.110 g/cm$^3$ and the relative density was 99.30%.

Comparative Example 6

An ITO sintered body was obtained in the same manner as in Comparative Example 1 except that the chlorine content of the powder measured by a fluorescent X-ray analyzing method was 1000 ppm (0.1% by weight). The density of the resulted sintered body was 6.995 g/cm$^3$ and the relative density was 97.70%.

Comparative Example 7

An ITO sintered body was obtained in the same manner as in Example 1 except the heating process did not include maintenance at 1200° C. for 12 hours, and the chlorine content of the powder measured by a fluorescent X-ray analyzing method was 300 ppm (0.03% by weight). The density of the resulted sintered body was 6.981 g/cm$^3$ and the relative density was 97.50%.

Comparative Example 8

An ITO sintered body was obtained in the same manner as in Comparative Example 7 except that the chlorine content of the powder measured by a fluorescent X-ray analyzing method was 1000 ppm (0.1% by weight). The density of the resulted sintered body was 6.745 g/cm$^3$ and the relative density was 94.20%.

The results of the above-described examples are summarized in Tables 1, 2 and 3.

TABLE 1

|  | Dew point (° C.) | Moisture partial pressure (Pa) | Sintered body density (g/cm$^3$) | Relative density (%) |
| --- | --- | --- | --- | --- |
| Example 1 | −70 | 0.26 | 7.142 | 99.75 |
| Example 2 | −40 | 13 | 7.142 | 99.75 |
| Example 3 | −20 | 104 | 7.135 | 99.65 |
| Example 4 | −15 | 167 | 7.130 | 99.58 |
| Example 5 | −10 | 262 | 7.121 | 99.46 |
| Example 6 | 0 | 608 | 7.054 | 98.52 |
| Comparative example 1 | +10 | 1227 | 6.852 | 95.70 |
| Comparative example 2 | +15 | 1704 | 6.718 | 93.82 |
| Comparative example 3 | +25 | 3167 | 6.130 | 85.60 |

TABLE 2

|  | Dew point (° C.) | Oxygen concentration | Sintered body density (g/cm$^3$) | Relative density (%) |
| --- | --- | --- | --- | --- |
| Example 1 | −70 | 99.5% or more | 7.142 | 99.75 |
| Example 7 | −70 | 95% | 7.124 | 99.50 |
| Example 8 | −70 | 90% | 7.096 | 99.10 |
| Comparative example 1 | −70 | 50% | 6.924 | 96.70 |

TABLE 3

|  | Chlorine concentration | Maintenance at 1200° C. | Sintered body density (g/cm$^3$) | Relative density (%) |
| --- | --- | --- | --- | --- |
| Example 1 | 0.01% or less | 12 hours | 7.142 | 99.75 |
| Comparative example 5 | 0.03% | 12 hours | 7.110 | 99.30 |
| Comparative example 6 | 0.10% | 12 hours | 6.995 | 97.70 |
| Comparative example 7 | 0.03% | None | 6.981 | 97.50 |
| Comparative example 8 | 0.10% | None | 6.745 | 94.20 |

According to the present invention, a molded article obtained by molding any form of powders such as an indium-tin-oxide powder, a mixed powder of an indium oxide powder and a tin oxide powder, a mixed powder of an indium-tin-oxide powder and tin oxide powder, a mixed powder of an indium-tin-oxide powder and an indium oxide powder or the like can be used for sintering, and a compact ITO sintered body having high sintered density can be obtained easily, and the high density ITO sintered body obtained by the method of the present invention has excellent property as an ITO sputtering target and is industrially useful.

What is claimed is:

1. A method for producing an indium-tin-oxide sintered body comprising the steps of:

molding a powder comprising indium, tin and oxygen, and sintering the molded article in oxygen gas-containing atmosphere, wherein the halogen content of the powder comprising indium, tin and oxygen is 0.02% by weight or less, the concentration of oxygen in the oxygen gas-containing atmosphere is 90%or more during sintering, the partial pressure of moisture contained in the oxygen gas-containing atmosphere is reduced to 200 Pa or less during sintering by removing remaining moisture and moisture adhered to a furnace wall, furnace material and heat insulation material, and the molded article is maintained at a temperature in the range from 1500 to 1650° C. for 1 hour or more for sintering.

2. The method according to claim 1, wherein the concentration of oxygen in the oxygen gas-containing atmosphere is 95% or more during the sintering.

3. The method according to claim 1, wherein the powder comprising indium, tin and oxygen has the BET diameter of from over 0.05 $\mu$m to 1 $\mu$m or less, and the diameter at a cumulative particle size distribution of 50% is 1 $\mu$m or less.

4. The method according to claim 1, wherein the powder comprising indium, tin and oxygen is a powder obtained by calcining a hydroxide powder comprising indium, tin, oxygen and hydrogen in an atmosphere gas containing hydrogen halide gas or halogen gas in an amount of 1% by volume or more.

5. The method according to claim 1, wherein the molded article is maintained at a temperature in the range from 1000 to 1300° C. for 1 hour or more before the sintering.

6. An indium-tin-oxide sintered body obtained by the method according to claim 1.

7. An indium-tin-oxide sputtering target obtained by processing the indium-tin-oxide sintered body produced by the method according to claim 1.

* * * * *